United States Patent
McDanell et al.

(10) Patent No.: US 8,842,043 B2
(45) Date of Patent: Sep. 23, 2014

(54) METHODS TO EXTEND THE FREQUENCY LOCK RANGE OF A RECEIVED RF SIGNAL USING A PREAMBLE-BASED FREQUENCY ESTIMATE

(75) Inventors: Roger A. McDanell, Carmel, IN (US); Glenn A. Walker, Greentown, IN (US); Eric A. Dibiaso, Lebanon, PA (US); Michael L. Hiatt, Jr., Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 364 days.

(21) Appl. No.: 13/336,640

(22) Filed: Dec. 23, 2011

(65) Prior Publication Data

US 2013/0162466 A1 Jun. 27, 2013

(51) Int. Cl.
*G01S 19/29* (2010.01)

(52) U.S. Cl.
USPC .................................... 342/357.68

(58) Field of Classification Search
USPC .................................... 342/357.68
See application file for complete search history.

(56) References Cited

U.S. PATENT DOCUMENTS

| 4,856,027 A | 8/1989 | Nakamura et al. |
| 5,450,447 A | 9/1995 | Dutta |
| 5,742,908 A | 4/1998 | Dent |
| 5,790,784 A | 8/1998 | Beale et al. |
| 7,702,040 B1 | 4/2010 | Yuan et al. |
| 2006/0193407 A1 | 8/2006 | Dibiaso et al. |
| 2011/0033016 A1* | 2/2011 | Jiang et al. ............... 375/354 |
| 2011/0285588 A1 | 11/2011 | Martin et al. |

FOREIGN PATENT DOCUMENTS

| EP | 0 297 774 A2 | 1/1989 |
| WO | 97/20398 A1 | 5/1997 |

OTHER PUBLICATIONS

European Search Report dated Jun. 19, 2014.

* cited by examiner

*Primary Examiner* — Harry Liu
(74) *Attorney, Agent, or Firm* — Lawrence D. Hazelton

(57) ABSTRACT

A method is presented to extend a frequency lock range of a received RF signal in a satellite receiver. One step in the method includes analyzing data information of a preamble associated with the received satellite RF signal. Another step includes determining an estimated frequency value that is a function of the analyzed data information that further includes at least a portion of the frequency error formed therein. A further step includes comparing the determined estimated frequency value to a predetermined threshold value. Another step includes using the determined estimated frequency value when the determined frequency value is greater than the predetermined threshold value to operatively control tracking mode electronic circuitry disposed in the satellite receiver to attain frequency lock on the received satellite RF signal.

22 Claims, 9 Drawing Sheets

METHODS TO EXTEND THE FREQUENCY LOCK RANGE OF A RECEIVED RF SIGNAL USING A PREAMBLE-BASED FREQUENCY ESTIMATE

TECHNICAL FIELD

This invention relates to a satellite communication system, more particularly, a satellite receiver includes provisions to detect frequency error using an estimated frequency value to attain frequency lock of a received radio frequency (RF) signal when the satellite receiver is experiencing weak satellite signal conditions.

BACKGROUND OF INVENTION

It is known to use a frequency tracking feedback loop to attain frequency lock of a received radio frequency (RF) signal in a satellite radio.

Referring to prior art FIG. 1, one such satellite radio has a conventional frequency tracking feedback loop (1) that includes a frequency shifter CORDIC (3), a matched filter (4), and a decimate by 2 block (5). An input/output (I/O) signal received from the analog-to-digital converter (A/D) of the satellite radio is input in to the frequency shifter CORDIC (3) and is subsequently is electrically transmitted to downstream to the matched filter (4) and the decimate by 2 (5) blocks to electrically feed the symbol demodulation block (6). The electrical signal that is output from the decimate by 2 block (5) is electrically transmitted back to the frequency shifter CORDIC (3) through a feedback loop that includes a Costas Phase Error block (7) and a loop filter block (8). This frequency tracking feedback loop (1) works well in an open land environment where strong satellite signals are broadcast and received by the satellite receiver that are relatively free from obstructions, such as trees and road tunnels underlying road overpasses. However, should the vehicle travel through a portion of the land environment that contains a thick canopy of trees or an extended road tunnel, a weak satellite signal condition may manifest as a result of these obstructions such that the tracking mode frequency loop (1) may not effectively track, or attain frequency lock on a received satellite radio frequency (RF) signal of the broadcasted satellite RF signal. When the frequency tracking feedback loop does not effectively track the received satellite RF signal, a user of the satellite radio, or receiver may experience an undesired loss of received RF signal reception so that a defective listenable audio stream may occur when the vehicle movingly travels through these types of obstructions.

Thus, what is needed is a satellite receiver that has an improved tracking mode feedback loop that allows robust operating performance in weak satellite signal conditions by determining an independent frequency estimate that is a function of data information derived from a preamble of the received satellite RF signal that is used by the satellite receiver to electrically steer the tracking mode frequency loop in a direction during the weak satellite signal condition towards a predetermined tracking range of the tracking mode electronic circuitry so that the tracking mode frequency loop obtains frequency lock of the received satellite RF signal and a quality listenable audio stream for the user is effectively maintained.

SUMMARY OF THE INVENTION

In accordance with one embodiment of the invention, a method is presented to extend a frequency lock range of a received RF signal in a satellite receiver. One step in the method includes analyzing data information of a preamble associated with the received satellite RF signal by the satellite receiver. Another step of the method includes determining an estimated frequency value by the satellite receiver that is a function of the analyzed data information that further includes at least a portion of said frequency error formed therein. A further step in the method includes comparing the determined estimated frequency value to at least one predetermined threshold by the satellite receiver. Another step includes using the determined estimated frequency value by the satellite receiver when the determined frequency value is greater than said at least one predetermined threshold to operatively control tracking mode electronic circuitry disposed in the satellite receiver to attain said frequency lock on the received satellite RF signal.

In accordance with another embodiment of the invention, a communication system that includes a satellite receiver that performs the method previously described above herein is also presented.

In accordance to a further embodiment of the invention, another method is presented to extend a frequency lock range of a received RF signal in a satellite receiver. The method includes a step that determines an estimated frequency value that is a function of the difference phase error value that is compared to a predetermined threshold in another step, such that when the determined estimated frequency value is greater than the predetermined threshold, the determined estimated frequency value is used to operatively control tracking mode electronic circuitry of the satellite receiver.

These and other advantageous features as disclosed in the embodiments of the present invention will be become apparent from the following brief description of the drawings, detailed description, appended claims and drawings.

BRIEF DESCRIPTION OF THE DRAWINGS

This invention will be further described with reference to the accompanying drawings in which.

DETAILED DESCRIPTION

Figure 1:
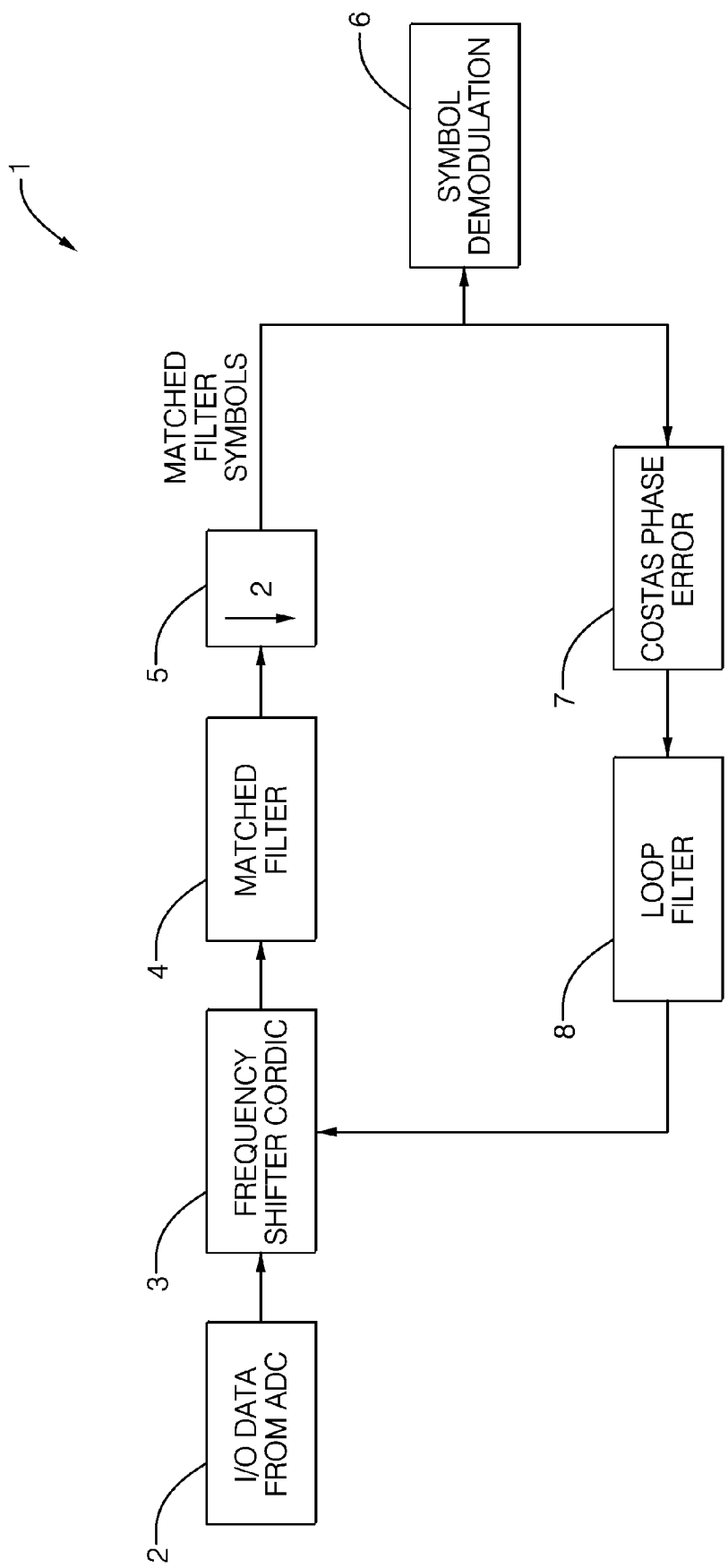
FIG. 1 shows a conventional frequency tracking feedback loop that employs a Costas Phase Error electrical block disposed in a digital signal processor (DSP) of a satellite radio.

Satellite radio services provide pay-for service menu of listening channels that include high-fidelity music, sports, news, and entertainment that is broadcast 24 hours per day, is commercial-free, and uncensored. Satellite radio services may be received in a mobile configuration, such as a satellite receiver installed in a vehicle, or in a stationary environment, such as the satellite receiver being placed on a desk in an office of a building. Regardless of location, operators and users of satellite receivers enjoy listening to a meaningful satellite signal that is error-free.

Precise frequency tracking is needed for proper data demodulation in a MPSK system. To accomplish this, an acquisition mode and a tracking mode may be employed. The acquisition mode is used when large frequency error between a broadcast and received satellite RF signal must be determined quickly. The tracking mode is then used to eliminate any further residual frequency error. In weak satellite signal conditions, the frequency error estimates may have large variance that lead to slow frequency acquisition and difficulty in determining the proper switch-over time from acquisition mode to tracking mode. If the tracking mode is entered prematurely, or if the tracking loop drifts during signal blockage, a frequency error which is too large for the tracking mode to eliminate may occur. When these situations occur, attaining frequency lock of the received satellite RF signal may not occur such that a defective listenable audio stream, or no audio stream may occur for a user of the satellite receiver. Providing improved frequency tracking loop performance using a preamble-based estimate, or estimated frequency value as described herein is advantageous to ensure an error-free audio listening experience for a user of the satellite receiver when a vehicle is driving in a driving environment where the satellite receiver experiences a weak received satellite RF signal condition. The estimated frequency value assists to operatively control the satellite receiver by detecting frequency error between a broadcast satellite RF signal and the received satellite RF signal to better attain frequency lock of the received RF signal which results in an extended frequency lock range of the satellite receiver, especially when the satellite receiver is experiencing weak satellite signal conditions.

The following terms used in the specification herein have the following definitions.

Binary Phase-Shift Keying (BPSK)—BPSK is a form of Phase Shift Keying in which one bit is modulated per symbol selecting one of two possible carrier phase shifts (0 or 180 degrees). Further, BPSK may key binary data or Morse code dots and dashes.

Corrected phase value—The corrected phase value is a function of a mathematical numerical sign of the estimated frequency value determined in a tracking mode feedback loop of a satellite receiver being applied to the absolute value of the Costas Phase Error output signal.

Costas Phase Error electrical block—The Costas phase error electrical block measures the phase error of a received BPSK or QPSK symbol independent of the data bits received.

Data information of the preamble—Data information of the preamble is a known data sequence that occurs in both the matched filter symbols and a preamble table of the satellite receiver. The matched filter symbols and the known preamble data are multiplied together in multiplier 192 of FIG. 6 to remove data modulation from the preamble of the received satellite RF signal in the satellite receiver. This results in a phase error value(s) that linearly rotate at a rate of frequency to be estimated. See FIG. 8.

Decimate by 2 electrical block—The decimate by 2 electrical block discards every other matched filter symbol at the output of the decimate by 2 electrical block.

Defective listenable audio stream—A defective listenable audio stream generally may be characterized as an absence of a quality listenable audio stream to the ears of a user of the satellite receiver. The defective listenable audio stream may include listenable audio frequency interruptions, mutes, audio drop outs, or any type of undesired anomaly that prevents a quality listenable audio stream from being attained and heard by the user of the satellite receiver.

Figure 8:
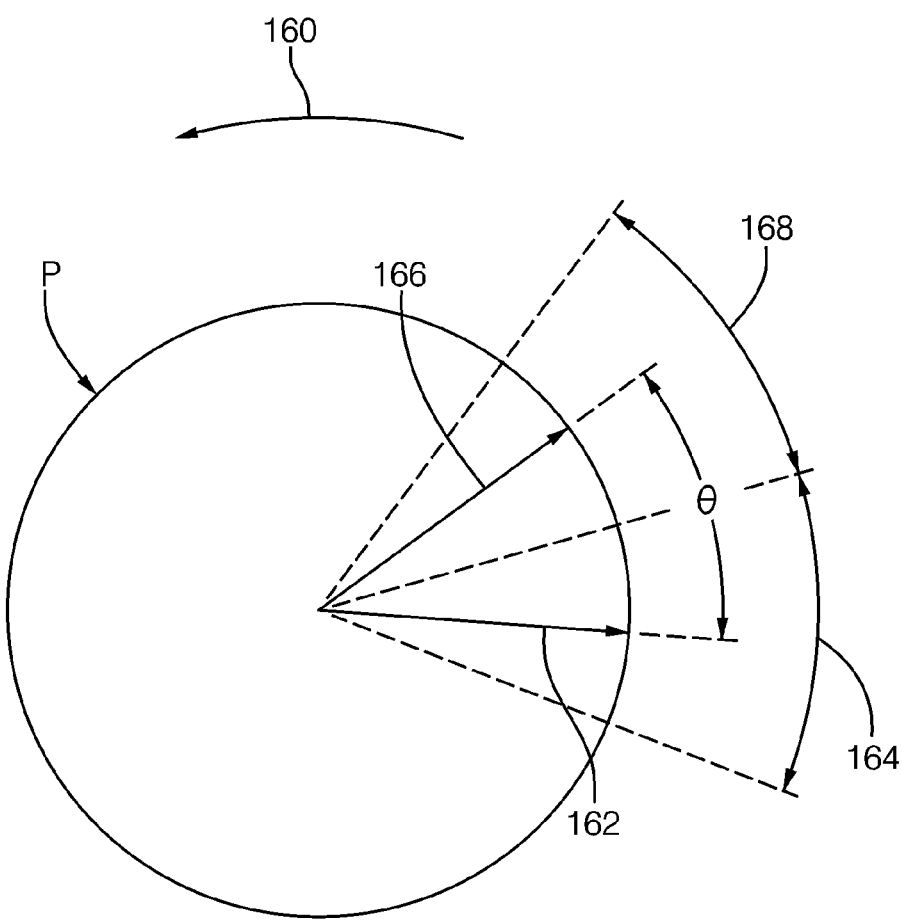
FIG. 8 shows respective phasor relationships of a first and a second digitally sampled portion of the preamble of FIG. 7 and an angular phase difference angle disposed therebetween in which the determined estimated frequency value is a function of the angular phase difference angle.

Difference Phase Error Value—The difference between the second phase error value subtracted from the first phase error value. The first phase and second phase error value may have phasor representation. This difference phase error has angular measure that has frequency error rotation around a circle, as best illustrated in FIG. 8. Frequency error is a function of the difference of the phase error values.

Digital Signal Processor (DSP)—The DSP conducts numerical and mathematical operations on sampled signal data. The DSP is part of the electronic circuitry that is disposed in the satellite receiver.

Estimated frequency value—An estimated frequency value is determined in a tracking mode frequency loop disposed in a DSP of a satellite receiver in a preamble-based estimator block. The estimated frequency value is determined based on the input of matched filter symbols and the input of a preamble sequence that is analyzed by the satellite receiver. The preamble sequence is associated with a preamble associated with a broadcast and a received satellite RF signal. The received satellite signal is received by the satellite receiver. More particularly, the estimated frequency value is further a function of a first portion of the preamble and a second portion of the preamble where the first and second portion are respectively analyzed and digitally sampled by the satellite receiver and summed together by the satellite receiver such that an angular measurement between a phasor representation of the first portion and a phasor representation the second portion is attained. The estimated frequency value is a function of this angular measurement which is calculated using an applied arctangent mathematical relationship also disposed in the preamble-based frequency estimator block of the satellite receiver.

Frequency shifter CORDIC—The function of this electrical block is to rotate input matched filter symbol data at a frequency determined by a command input that additionally modifies the rotation based on the command input.

Listenable audio frequency interruptions—Any audio electrical disturbance, such as audio-frequency noise, introduced from a source external to a baseband and/or audio electrical signal of the satellite receiver that detracts the user's satellite receiver listening experience. These listenable audio frequency interruptions may fall in an audio frequency range from about 15 Hertz (Hz) to 20 kiloHertz (kHz).

Matched Filter electrical block—The filter applied to the received RF signal which minimizes the effect of noise while producing the maximum signal-to-noise (S/N) power at the output of the matched filter electrical block.

Matched Filter Symbol—An output of the matched electrical filter block.

Multiple Phase-Shift Keying (MPSK)—MPSK is a general form of Phase Shift Keying in which multiple bits are modulated per symbol selecting one of multiple possible carrier phase shifts.

Mute—A mute is generally any type of undesired noise disturbance. The undesired noise disturbances are listenable audio frequency interruptions that are heard through an audio output of the satellite receiver, such as a speaker, by an ear of the human user of the satellite receiver.

Phase error value—The satellite receiver has both a first and a second phase error value. When the phasor representation of the second phase error value is subtracted from the phasor representation of the first phase error value results in a difference phase error value. The difference phase error value is the estimated frequency value.

Phasor—An entity which includes the concepts of magnitude and direction in a reference plane. The first sampled portion and the second sampled portion of the preamble of the received RF signal may be represented as phasors.

Preamble—A known bit sequence that is periodically transmitted that has fixed length that is associated with the broadcast satellite RF signal and received as a received satellite RF signal by the satellite receiver. The estimated frequency value, as previously described herein, is a function of a first portion of the preamble and a second portion of the preamble.

Figure 6:
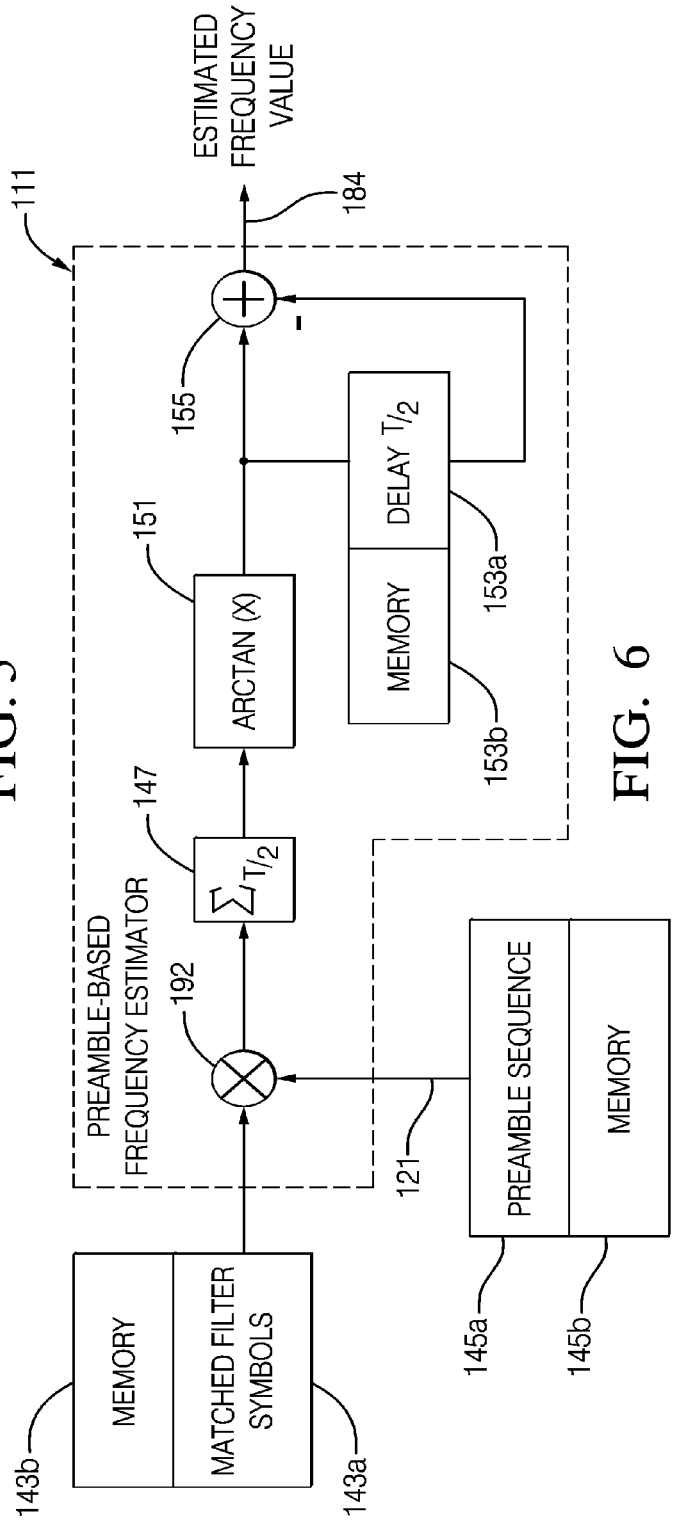
FIG. 6 shows an electrical block diagram of the preamble-based frequency estimator block disposed in the tracking mode feedback loop of FIG. 4.
Figure 7:
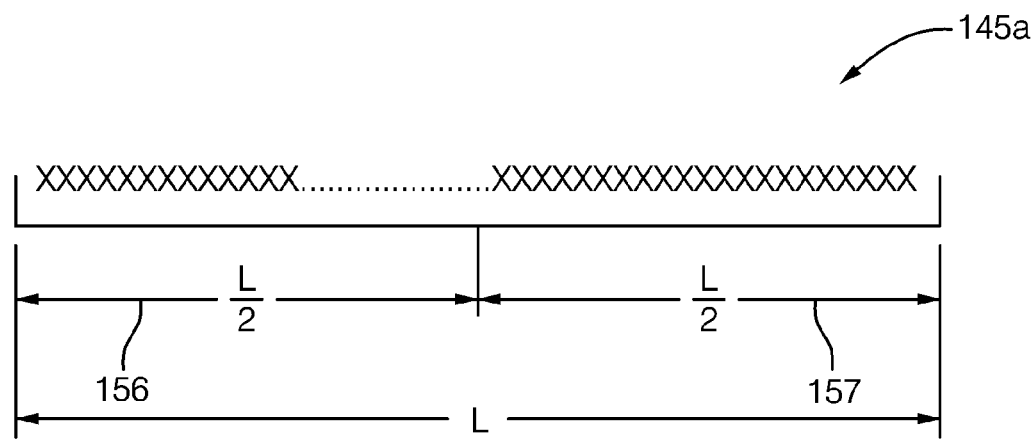
FIG. 7 shows a preamble of the received satellite RF signal having a total word length L that is associated with a preamble sequence that is electrically input in to the preamble-based frequency estimator block of FIG. 6.

Preamble-based frequency estimator block—A block in a tracking mode feedback loop that produces an estimated frequency error that is configured for use to control tracking mode electric circuitry in the satellite receiver. Referring to FIG. 7, a first portion of a preamble formed as a preamble sequence as illustrated in FIG. 6 is processed by this block followed by the block processing a second portion of the preamble formed as another preamble sequence processed by this block. The preamble sequence of the first portion of the preamble contains a phase error value that is converted to phasor representation as illustrated in FIG. 8 after an arctangent function 151 within the preamble-based frequency estimation electrical block 111 is preformed thereon. Subsequently, the preamble sequence of the second portion of the preamble contains a phase error value that is converted to phasor representation as illustrated in FIG. 8 after an arctangent function 151 within the preamble-based frequency estimation electrical block 111 is preformed thereon. The preamble sequence of the first portion and the second portion of the preamble has been previously digitally sampled by the satellite receiver. Every time a known periodic preamble associated with the received satellite RF signal is identified by the satellite receiver the preamble-based frequency estimator block determines an estimated frequency value in a manner as previously described above. In this manner the estimated frequency value is updated every time a known preamble is identified by the satellite receiver.

Preamble Sequence—The difference of the preamble and the preamble sequence that the preamble sequence consists of the first portion of the preamble and the second portion of the preamble stored in memory. The first portion of the preamble sequence electrically is input to the preamble-based estimator block followed by the second portion of the preamble sequence that is input in to the preamble-based estimator block for processing to determine a estimate frequency value.

Preamble Table—Stored in a memory of the satellite receiver. The preamble table is that which stores the preamble sequence of the first and second portions of the preamble in memory.

Predetermined threshold value—The predetermined threshold value is a digital value stored in memory. The predetermined threshold value is preferably determined before the satellite receiver is manufactured. Additionally, the predetermined threshold value is preferably stored in the memory of the satellite receiver during the manufacturing process when the satellite receiver is fabricated. The predetermined threshold value is determined in relation to a predetermined phase tracking range associated with the tracking mode electronic circuitry. The tracking mode electronic circuitry generally includes the electronic circuit elements of the loop filter and the frequency shift CORDIC. The predetermined phase tracking range is in relation to design parameters of the satellite receiver that includes the signal-to-noise (S/N) ratio design parameters of the satellite receiver. Comparing the determined estimated frequency value with the predetermined threshold value allows the tracking mode electronic circuitry to be steered in a direction towards the predetermined phase tracking range so that the received satellite RF signal is able to be locked in a weak satellite signal condition being experienced by the satellite receiver.

Quadrature Phase-Shift Keying (QPSK)—QPSK is a form of Phase Shift Keying in which two bits are modulated at once, selecting one of four possible carrier phase shifts (0, 90, 180, or 270 degrees; or any other four angular measures separated by 90 degrees). QPSK allows the signal to carry twice as much information as BPSK using the same bandwidth. QPSK is used for satellite transmission of MPEG2 video, cable modems, videoconferencing, cellular phone systems, and other forms of digital communication over an RF carrier.

Quality listenable audio stream—A quality listenable audio stream is one that is absent of mutes or other undesired electrical disturbances and desired by a user of the satellite system.

Received satellite signal data transmission—This term refers to the digital baseband signal in the signal path of the satellite receiver.

Signal path—A signal path is an electrical transmission route that a baseband electrical signal follows through the satellite receiver en route to being audibly reproduced by a speaker of the satellite radio. The baseband signal may be an analog baseband signal that generally starts on the signal path of the satellite receiver after the phase shift mixers in the front end of the satellite receiver. The analog baseband signal transitions to a digitally represented baseband signal on the signal path at an output of the analog-to-digital converters (ADC). The ADCs are disposed on the signal path downstream from the phase shift mixers. The DSP of the satellite receiver further processes the digital baseband signal along the signal path of the satellite receiver.

Symbol demodulation electrical block—This block is used to perform signed bit decoding of the matched filter symbols. In the case of the outer receiver of the DSP, the symbol demodulation electrical block passes on soft bit data to the deinterleaver and the forward error correction electrical blocks. The outer and inner receiver including the deinterleaver are further described in U.S. non-provisional application U.S. Ser. No. 13/267,505 entitled "SATELLITE RECEIVER PERFORMANCE ENHANCEMENTS" filed on Oct. 6, 2011 which is hereby incorporated by reference herein.

Tracking mode electronic circuitry—Encompasses the error detection, error filtering, and frequency command to the frequency shifter CORDIC electrical block that are disposed in the tracking mode feedback loop. These electronic circuit elements, used in combination, assist the satellite receiver to attain frequency lock of the received satellite RF signal when the satellite receiver is experiencing a weak satellite signal condition.

Tracking mode feedback loop—A feedback loop that determines an estimated frequency value used to steer the tracking mode electronic circuitry in a direction so as to be within a predetermined phase tracking range of the tracking mode electronic circuitry so that when the satellite receiver is disposed in a location and experiences weak satellite signal conditions, the satellite receiver still attains frequency lock of a received satellite RF signal.

Figure 2:
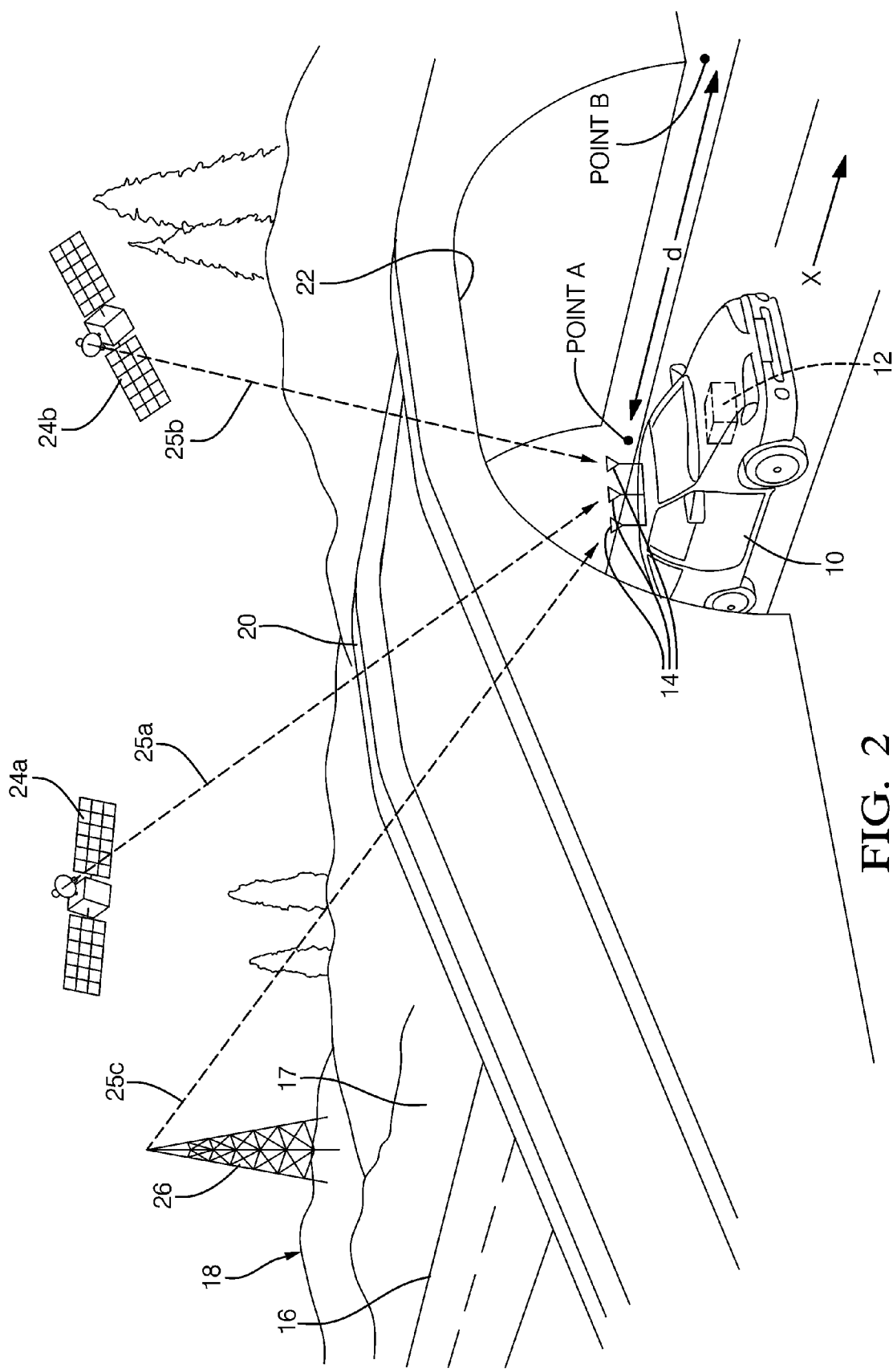
FIG. 2 shows an environmental view that includes a vehicle traveling along a road having a satellite receiver that includes a tracking mode feedback loop that determines an estimated frequency value according to the invention.

In accordance with an embodiment of the invention, referring to FIG. 2, a vehicle 10 includes a communication system that includes a satellite receiver 12 disposed in vehicle 10. The communication system is a multiple phase shift keying (MPSK) communication system. Satellite receiver 12 is in electrical communication with a plurality of antennas 14. Vehicle 10 is traveling along a road 16 in a forward direction x in a ground-based earth environment 18 that further includes an overpass road, or overpass 20 that overlies road 16. Overpass 20 allows other motorized vehicles to travel in a transverse direction over road 16 without further delay, such as may be imposed if a stop sign or stoplight was incurred adjacent road 16. The area disposed underlying overpass 20 forms a tunnel 22 for vehicle 10. Vehicle 10 enters tunnel 22 at point A traveling in a forward direction x and exits tunnel at point B. A depth, or distance d is defined between point A and point B. Vehicle antennas 14 respectively electrically communicate with spaced-based satellites 24a, 24b and a land-based terrestrial antenna 26. Satellites 24a, 24b generally movingly operate, or orbit in a space-based environment that overlies ground-based earth environment 18, as is known in the satellite arts. Satellites 24a, 24b broadcast satellite RF signals 25a, 25b into ground-based earth environment 18 and terrestrial antenna 26 broadcasts ground-based satellite RF signal frequencies 25c in to ground-based earth environment 18.

When vehicle 10 is driving in tunnel 22, satellite receiver 12 may experience a weak satellite signal condition of the received satellite RF signal. In contrast to vehicle 10 traveling along road 16 in an open land environment 17 before reaching tunnel 22, the physical structure of tunnel 22 may undersirably provide an impediment for satellite receiver 12 to adequately receive broadcast satellite RF signals 25a-c. Open land environment 17 is generally void of trees or tunnels or other obstructions that may otherwise hinder the receiving of the broadcasted RF satellite signal from satellites 24a, 24b or terrestrial antenna 26. It is desired to have a quality listenable audio stream emit from satellite receiver 12 at any point in tunnel 22 along distance d of road 16. As illustrated in FIG. 2, distance d is a relatively short distance. Other road tunnels may have a much longer depth. In one alternate embodiment, the depth of the tunnel may be such that it may take eight (8) seconds or more for the vehicle to drive through the tunnel before exiting.

Figure 3:
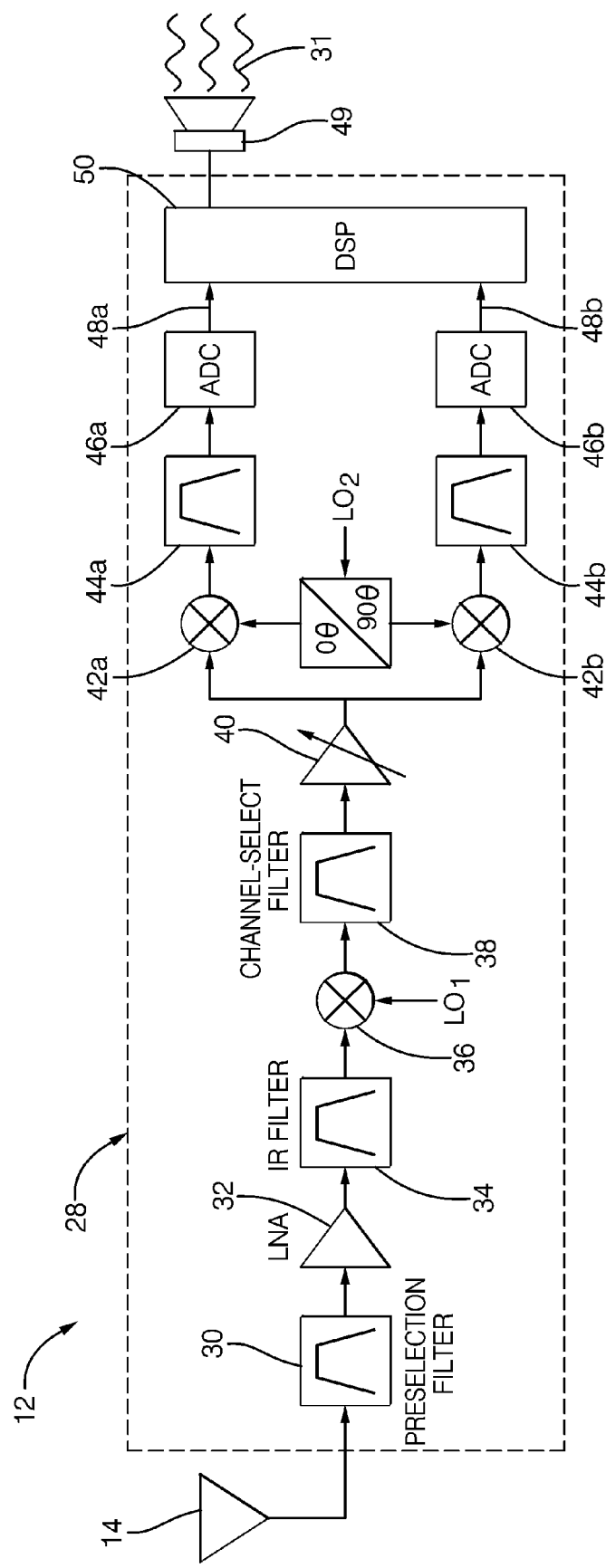
FIG. 3 shows a portion of an electrical schematic of the satellite receiver of FIG. 2 that includes a DSP that contains the tracking mode feedback loop that determines the estimated frequency value.

Referring to FIG. 3, a front end 28 of satellite receiver 12 is illustrated. Front end 28, along with other portions of satellite receiver 12 are constructed of printed circuit boards (PCBs) that include electrical circuits made from any electrical type device, such as diodes, resistors, capacitors, integrated circuits (ICs), relays, and transistors as is known in the satellite receiver arts. The PCBs may be formed from FR4 material. The PCBs are assembled and fastened in one or more housings made of solid material such as metal or plastic. The portion of satellite receiver 12 shows at least a front end 28 of satellite receiver 12. For simplicity, only one antenna 14 in FIG. 3 is shown that generally represents plurality of antennas 14 attached to vehicle 10, as illustrated in FIG. 2. Front end 28 includes antenna 14, a preselection filter 30, a low noise amplifier (LNA) 32, an image rejection (IR) filter 34, and a first mixer 36. Satellite receiver 12 receives at least one of satellite RF signals 25a-c and antenna 14 electrically couples these signals in to satellite receiver 12. Preselection filter 30 removes out of band energy as well as partially reject image band received satellite RF signals. LNA 32 provides gain while also suppressing the contribution of noise from the succeeding stages. The image reject (IR) filter attenuates the RF signals at image band frequencies coming from LNA 32. First mixer 36 down-converts the satellite RF signals by mixing with a first local oscillator signal LO1 to a first IF frequency. Channel select filter 38 selects a smaller satellite frequency band while rejecting other adjacent RF frequencies which could interfere with the RF signal selection. Channel select filter 38 is also critical in determining satellite receiver sensitivity and selectivity. Another amplifier 40 provides selectable gain to the operator's selected channel that is input to phase shift mixers 42a, 42b. One of the phase shift mixers 42a phase shifts the analog RF signal by zero degrees and the other one of the phase shift mixers 42b phase shifts the signal by 90 degrees to produce in-phase (I) and quadrature (Q) signal components. The respective phase shifted signals from phase shift mixers 42a, 42b are then low pass filtered (LPF) by LPF filters 44a, 44b which act as a channel reject filter and are used for anti-aliasing functionality and then are converted from respective analog baseband signals to digital baseband signals by A-to-D converters (ADCs) 46a, 46b. The respective digital baseband signals are output in a signal path 48a, 48b of satellite receiver 12 in to digital signal processor (DSP) 50. A speaker 49 is electrically coupled to DSP 50 and plays a listenable audio stream 31 of a selected signal of received RF signals from broadcast RF signals 25 that is heard by the operator. Other alternative front end configurations to process the analog satellite RF signals to digital base band signals are left to the artesian. The tracking mode feedback loop performance as described herein is associated with features and functionality disposed in DSP 50. Satellite receiver 12 is a dual conversion architecture with a first IF stage that converts the received satellite RF signal to an first IF frequency and a second IF stage that converts the received satellite RF signal from the first IF frequency down to a baseband signal at DC.

Figure 4:
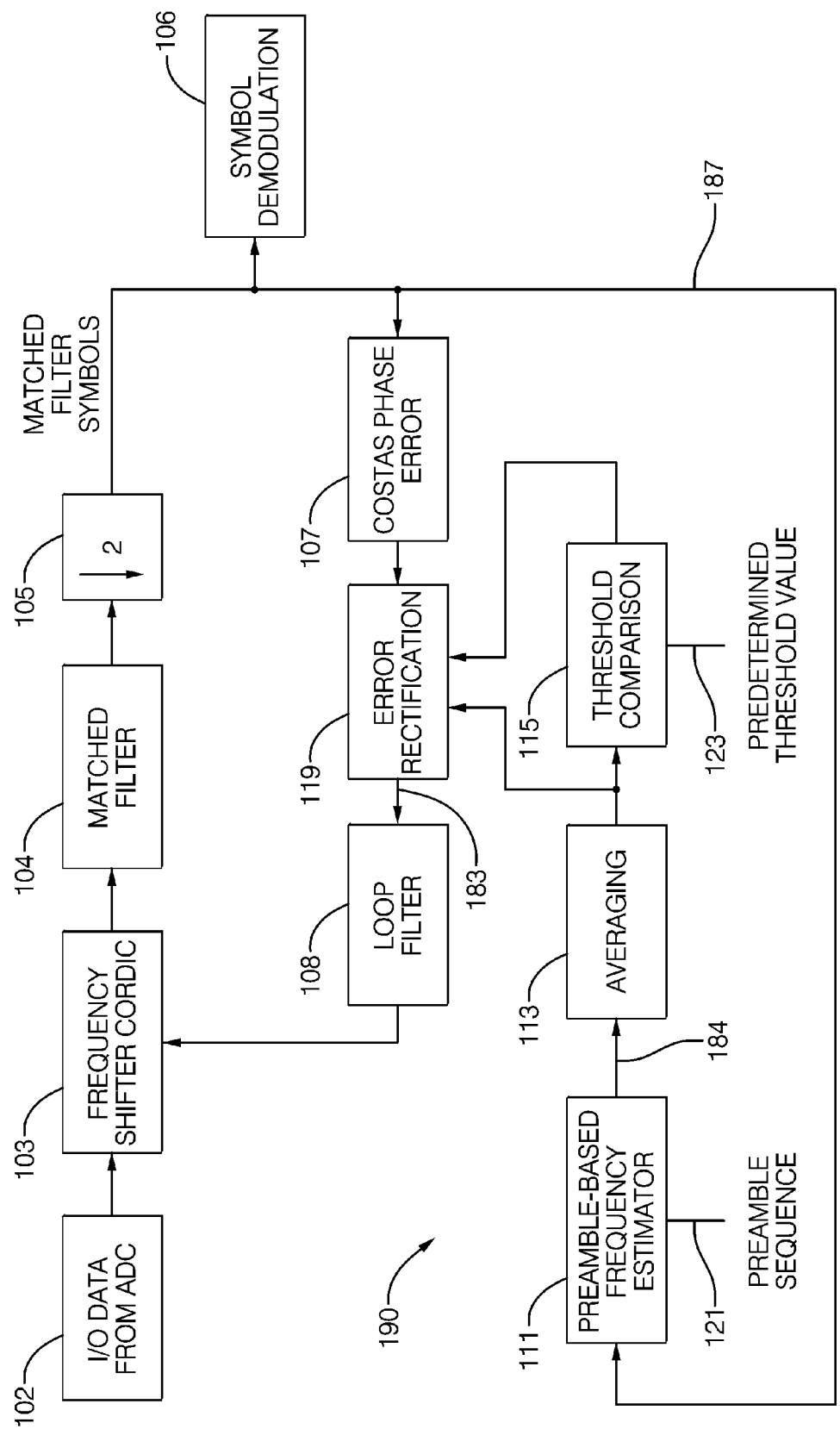
FIG. 4 shows the tracking mode feedback loop of FIG. 3 that determines the estimated frequency value, and details thereof.

Referring to FIGS. 3-9, a portion of electrical blocks that form DSP 50 are illustrated that include electrical devices as previously described herein. Referring to FIG. 4, a portion of DSP 50 includes an inner receiver that receives digital base band signals received along signal path 48 from A/D converters (ADCs) 46a, 46b as illustrated in FIG. 3. Inner receiver conducts additional signal processing on these received baseband signals after being digitized by ADCs 46a, 46b. The inner receiver includes the following electrical functional blocks: a frequency shifter CORDIC electrical block 103 that receives the digital baseband signal from ADCs 46a, 46b as represented by I/O data from IDC block 102, a matched filter block 104, and a decimate by 2 block 105. The output of decimate by 2 block 105 is electrically transmitted to a symbol demodulation block 106 and tracking mode electronic circuitry 190. Tracking mode electronic circuitry 190 includes the following electrical blocks: a Costas Phase Error electrical block 107, an error rectification block 119, a loop filter block 108, a preamble-based frequency estimation electrical block 111, and an averaging block 113, and a threshold comparison block 115. The electrical signal output from the decimate by 2 block 105 on signal path 187 electrically feeds Costas Phase Error electrical block 107, preamble-based frequency estimation electrical block 111, and symbol demodulation block 106.

Figure 9:
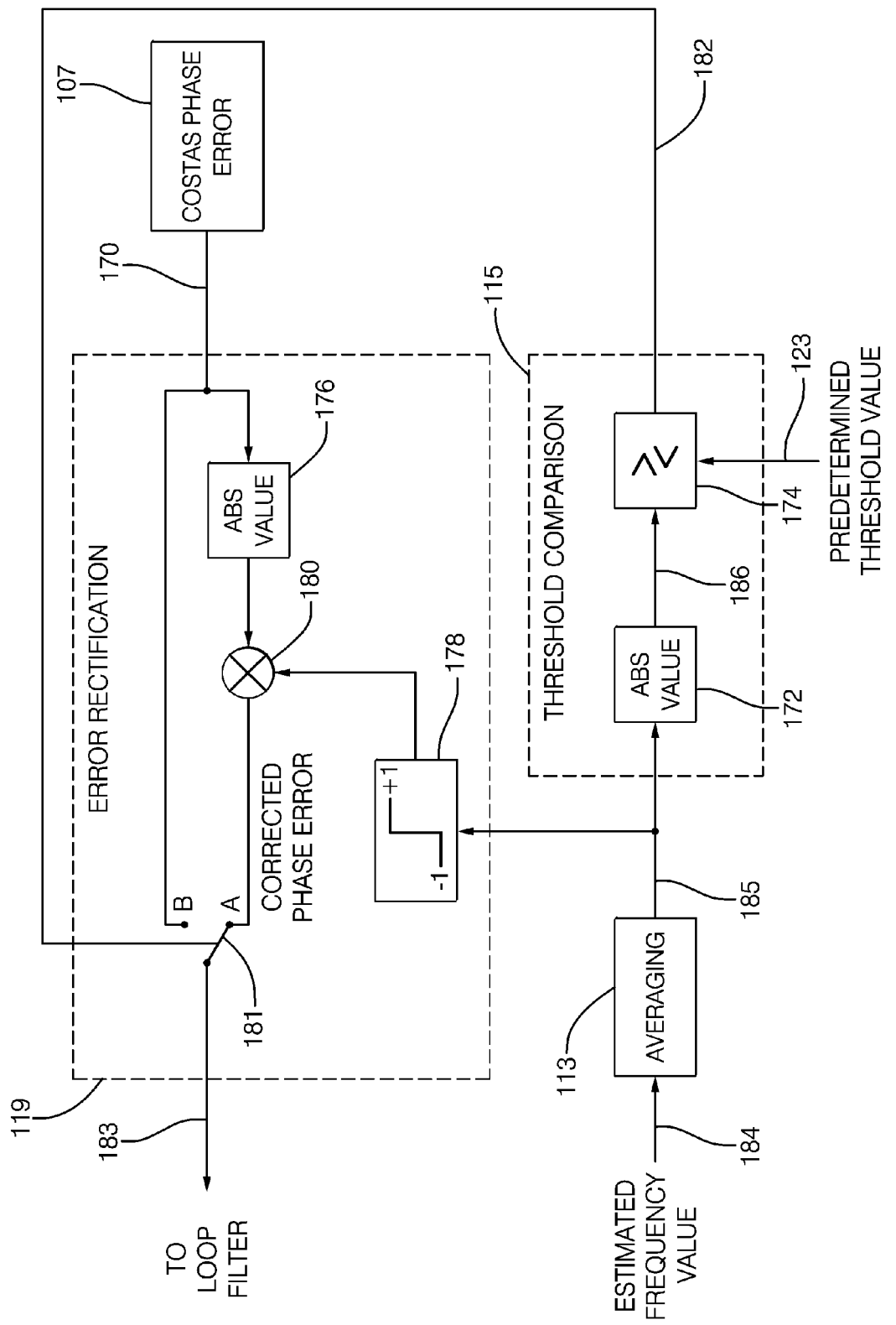
FIG. 9 shows further electrical circuit details of the tracking mode feedback loop of FIG. 4 that determines the estimated frequency value.

Preamble-based frequency estimation electrical block 111 determines the estimated frequency value for tracking mode electronic circuitry 190 disposed in satellite receiver 12, frequency shifter CORDIC electrical block 103, and a symbol demodulation electrical block 106. The estimated frequency value is output as a digital electrical signal on electrical signal path 184. Referring to FIG. 9, the estimated frequency value on signal path 184 is input to averaging block 113. The estimated frequency values calculated during the presence of each periodic preamble sequence are input to averaging block 113. Averaging block 113 digitally smooths the inputted individual estimated frequency values so that reception noise introduced during any particular estimated frequency value calculation is reduced. The result is a more accurate representation of the estimated frequency value that is output on signal path 185 as best illustrated in FIG. 9. The more accurate estimated frequency value ensures proper decision making in the threshold comparison block 115, error rectification block 119, to produce the corrected phase error signal, as best illustrated in FIG. 9.

The averaged estimated frequency value electrical signal is input to threshold comparison block 115 and error rectification block 119 along signal path 185. A mathematical numerical sign is applied to the averaged estimated frequency value by mathematical numerical sign block 178 in error rectification block 119. The mathematically signed average estimated frequency value is then applied to a Costas Phase Error signal output on signal path 170 from Costas Phase Error electrical block 107 that has had an absolute value mathematical function applied by absolute value block 176. The resultant electrical signal output from multiplier 180 is a corrected phase error electrical signal that is carried on signal path 183 when switch 181 is set to position A, as illustrated in FIG. 9. When switch 181 is set to position A, the estimated frequency value is used to steer the tracking mode electronic circuitry in frequency shifter CORDIC electrical block 103 in to the predetermined tracking range associated with the tracking mode circuitry during weak satellite signal conditions of the received RF signal in satellite receiver 12.

Switch 181 is controlled between position A and a position B by a digital electrical signal carried on electrical signal path 182 that is an output of threshold comparison block 115 dependent on the threshold comparison of the averaged estimated frequency value and the predetermined threshold value. Alternately, electrical signal path 182 may carry an analog electrical signal to control the switch. Averaged estimated frequency value carried on signal path 185 is input to threshold comparison block 115. More particularly, averaged estimated frequency value is input to absolute value block 172 of threshold comparison block 115. After the absolute value is applied to the averaged estimated frequency value to ensure a positive average estimated frequency value, this signal is output on signal path 186. Signal path 186 an input to comparison block 174 where this electrical signal is compared against a predetermined threshold value on signal path 123. When the absolute value of the estimated frequency value is greater than predetermined threshold value carried on signal path 123, switch 181 is set to position B, as previously described herein. In this manner, signal path 183 carries corrected phase error signal to operatively control tracking mode electronic circuitry that includes loop filter block 108 and frequency shifter CORDIC electrical block 103.

Figure 5:
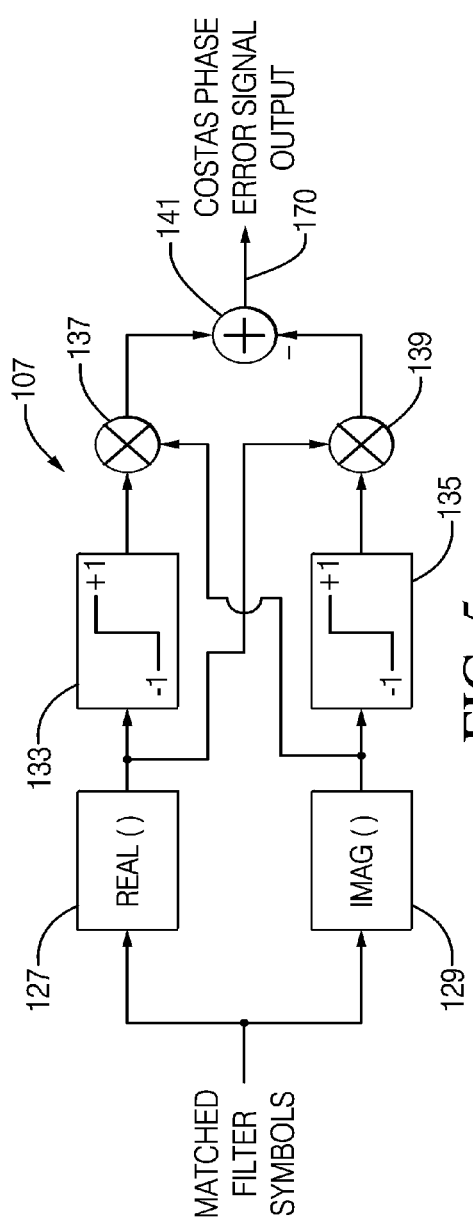
FIG. 5 shows an electrical schematic of the Costas Phase Error electrical block disposed in the tracking mode feedback loop of FIG. 4.

Referring to FIG. 5, further electronic circuit detail of Costas Phase Error electrical block 107 of FIG. 4 is illustrated. The Costas Phase Error electrical block measures the phase error of a received BPSK or QPSK symbol independent, for example, of the data bits received which are the matched filter symbols output from decimate by 2 block 105 of FIG. 4. Four (for QPSK) or two (for BPSK) possible symbols corresponding to the modulating data bits may be received from decimate by 2 block 105. The Costas Phase Error block produces the same error output for each of the possible data patterns. The received symbol is separated into real and imaginary components, respectively, in real component block 127 and imaginary component block 129. The hard limiters of blocks 133 and 135, combined with the multipliers of blocks 137 and 139 rectify the symbol in a way that strips off the data modulation and produces the Costas phase error independent of data pattern. The Costas Phase Error Signal is a result of summation of the real and imaginary components at an output from summer 141 on signal path 170 which is input to Error Rectification block 119 as illustrated in FIG. 9.

Turning our attention now to FIG. 6, the electrical blocks of preamble-based frequency estimation electrical block 111 are illustrated. Please also refer to the definition of "preamble-based frequency estimation block" for further operational details of this block, previously described herein. Matched filter symbols carried on signal path 187 are stored in memory 143b in DSP 50. Matched filter symbols are recalled from memory 143b and are input to a multiplier 192 of preamble-based frequency estimation electrical block 111. Preamble sequence 145a is also electrically transmitted to multiplier 192 from a memory 145b. A preamble sequence 145a from associated memory 145b is also input into preamble-based frequency estimation electrical block 111. Preamble-based frequency estimation electrical block 111 also includes a summation block 147, an arctangent function block 151, and a time delay block 153a with associated memory block 153. Preferably, memory 143a may be a random access memory (RAM), memory 145b may be a non-volatile memory, such as read-only memory (ROM), and memory 153b may be a simple memory register in DSP 50.

During periods where the matched filter symbols on signal path 187 correspond to data information from the known preamble in preamble sequence 145a, the matched filter symbols are point-wise, or sequentially multiplied with samples from the preamble sequence recalled by DSP 50 from memory 145b. Point-wise may be defined the elements of the predetermined preamble table are sequentially processed in the satellite receiver to electrically feed multiplier 192. Two summations of the point-wise multiplications are performed in summation block 147, one during the time the first half, or portions of the preamble sequences is present and one during the time the second half of the preamble sequence is present. The arctangent of the first half and second half sums are calculated in arctangent function block 151 as well as the difference of the angular results that have phasor representations 162, 166 as best illustrated in FIG. 8. Referring to FIG. 8, this difference angle theta ($\Theta$) represents the estimated frequency value represented as an electrical signal on signal path 184.

The matched filter symbols which are output from 105 of FIG. 4 are written to 143b memory at the time the periodic preamble sequence occurs. These received matched filter symbols are then read from 143a memory and point-wise multiplied with a copy of the noise-free known preamble sequence read from 145a memory. Two summations of the point-wise multiplications are performed in summation block 147, one corresponding to the first half of the preamble sequence and one corresponding to the second half of the preamble sequence. The arctangent of the first sum is stored in 153b memory. The arctangent of the second sum is calculated and the arctangent of the first sum read from 153a memory is subtracted. The resulting difference angle represents the estimated frequency value.

Referring to FIG. 7, a total word length L of a known preamble is associated with respective broadcast satellite RF signals 25a, 25b, 25c. Preamble sequence 145a is associated with the known preamble and the known preamble is sent periodically with respective broadcast satellite RF signals 25a, 25b, 25c that are received in to satellite receiver 12 as received satellite RF signals. DSP 50 of satellite receiver 12 is configured to divide total word length L of the preamble in half and analyze a first half, or portion 156 for preamble sequence 145a and a second half, or portion 157 for preamble sequence 145a. Thus, L/2 of the total word length, or 50% of bits of the preamble comprise first portion 156 of preamble 145a and another L/2, or the remaining 50% of total word length L of the bits comprise second portion 157 of preamble sequence 145a. The bits of second portion 157 are different than the bits of first portion 156. As illustrated in FIG. 7, first portion 156 and second portion 157 have about the same word length within the total word length L. In one embodiment, the total word length of the preamble may have about 2000 bits so that a first portion of this preamble would have the first 1000 bits and the second portion of the preamble would include the latter 1000 bits. Alternately, the first portion and the second portion may have about the same word length within the total word length, where that same word length is less than 50% of the total word length.

Referring to FIG. 8, an average phasor representation 162 of first portion 156 of the preamble and an average phasor representation 166 of second portion 157 of the preamble are illustrated. The phasor rotation is moving in a counterclockwise direction 160 around circle P. Difference angle theta ($\Theta$) is the angular measurement resulting from a difference of second portion average phasor representation 157 subtracted from the first portion average phasor representation 162. The direction of rotation is of the received matched filter symbols caused by the frequency error which is to be estimated. Arcs 164 and 168 show the trajectory of the possible phase error of the matched filter symbols during the respective first portion 156 and second portion 157 of the occurrence of the preamble. Average phasor representations 162 and 166 represent the angles resulting from the point-wise multiplication and summation of first portion 156 and second portion 157 of the preamble sequence in preamble-based frequency estimation electrical block 111 and average phasor representations 162, 166 are the average angle which occurs in each portion 156, 157 during the preamble multiplications and summations. Difference angle $\Theta$ represents the estimated frequency value and the difference angle $\Theta$ is an angular value that has a digital value that may be stored in a register of DSP 50. It is the digital value of the difference angle that is averaged in averaging block 113 and compared against predetermined threshold value 123 in threshold comparison block 115.

Referring back to FIG. 9, at least a portion of the determined estimated frequency value is input to electrical signal path 183 of DSP 50 at a point disposed intermediate the frequency shifter CORDIC electrical block 103 and Costas Phase Error electrical block 107. Electrical signal path 183 is in electrical communication with an input of frequency shifter CORDIC electrical block 103 so that the corrected phase error is electrically connected with frequency shifter CORDIC electrical block 103 when switch is in position B.

Preamble-based frequency estimation electrical block 111 of tracking mode electronic circuitry 190 is not in electrical operation in satellite receiver 12 when electrical power is not connected with satellite receiver 12.

Preamble-based frequency estimation electrical block 111 of tracking mode electronic circuitry 190 is in electrical operation in satellite receiver 12 when electrical power is connected with satellite receiver 12.

Figure 10:
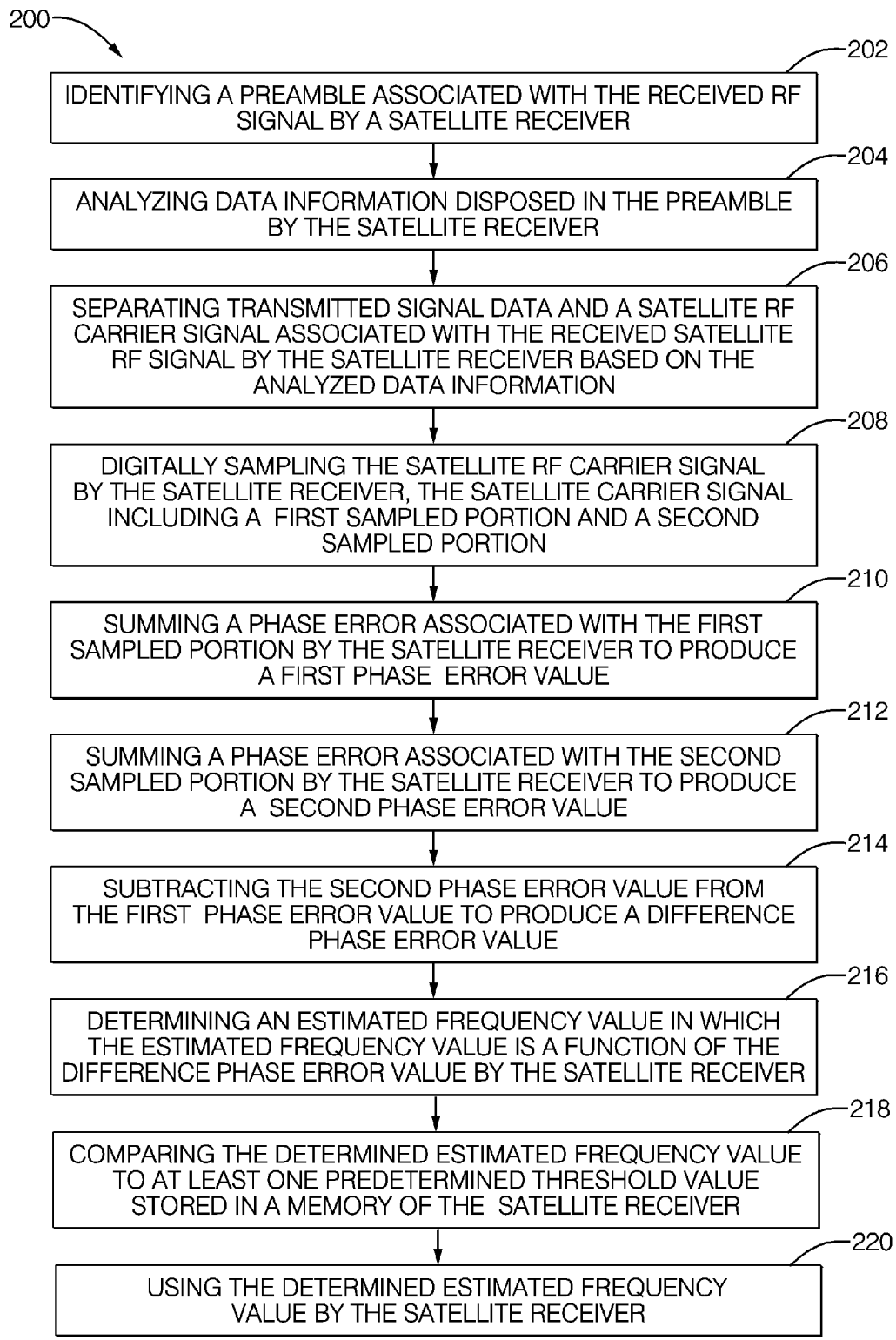
FIG. 10 shows a method to operatively control the satellite receiver of FIG. 2 to attain frequency lock of the received satellite RF signal.

Referring to FIG. 10, when tracking mode electronic circuitry 190 is electrically operative; tracking mode electronic circuitry 190 operates according to method 200. Method 200 is presented to operatively control a satellite receiver that detects frequency error between a broadcast satellite RF signal and a received satellite RF signal of the broadcast satellite RF signal to attain frequency lock of the received satellite RF signal. One step 202 in method 200 is identifying a preamble associated with the received satellite RF signal by satellite receiver 12. Identifying the preamble means the satellite receiver attempts to match the matched filter symbols with the known preamble of the received satellite RF signal. This may occur by counting down matched filter symbols to an expected reoccurrence of the preamble. Another step 204 in method 200 is analyzing data information disposed in the preamble, or preamble sequence 145a by satellite receiver 12. Refer to the definition of "data information of the preamble" for further details, as previously described herein. At the time of occurrence of the preamble in the sequence of match filter symbols, the matched filter symbols agree with data values stored in a predetermined preamble table of satellite receiver. The data information, or known data sequence of matched filter symbols and the preamble table are sequentially multiplied together to remove data modulation. This results in a phase error value(s) that linearly rotate at a rate of frequency to be estimated. This results in a product sequence that contains only a data sequence within the rotation to determine the estimated frequency value. Data information is a sequence of the preamble that is expected from a known matched filter symbol table for length L in FIG. 7 that is correlated to a known data table sequence of the matched filter. A further step 206 in method 200 is separating transmitted signal data and a satellite RF carrier signal associated with the received satellite RF signal by satellite receiver 12 based on the analyzed data information. Please see the definition of the "preamble-based frequency estimator block," for more detail, as previously described herein. Another step 208 in method 200 is digitally sampling the satellite RF carrier signal by DSP 50 of satellite receiver 12, the satellite RF carrier signal including a first sampled portion and a second sampled portion digitally sampled by satellite receiver 12 through the use of an analog-to-digital converter. Referring to FIG. 8, a further step 210 in method 200 is summing by summation block 147, as illustrated in FIG. 6, a phase error associated with the first sampled portion 156 by satellite receiver 12 to produce a first phase error value. Subsequently, another step 212 in method 200 is summing by summation block 147 at a later time, a phase error associated the second sampled portion 157 by satellite receiver 12 to produce a second phase error value. A further step 214 in method 200 is subtracting the second phase error value from the first phase error value to produce a difference phase error value by satellite receiver 12, as best illustrated in FIG. 8. Another step 216 in the method 200 is determining an estimated frequency value by satellite receiver 12 in which the estimated frequency value is a function of the difference phase error value. See the definition of "difference phase error value" for more detail, as previously described herein. A further step 218 in method 200 is comparing the determined estimated frequency value to at least one predetermined threshold 123 stored in a memory of satellite receiver 12. In yet another step 220 in the method 200 is using the estimated frequency value by satellite receiver 12 when the determined estimated frequency value carried on signal path 186 is greater than said at least one predetermined threshold value 123 to operatively control tracking mode electronic circuitry 108, 103 of satellite receiver 12.

Figure 11:
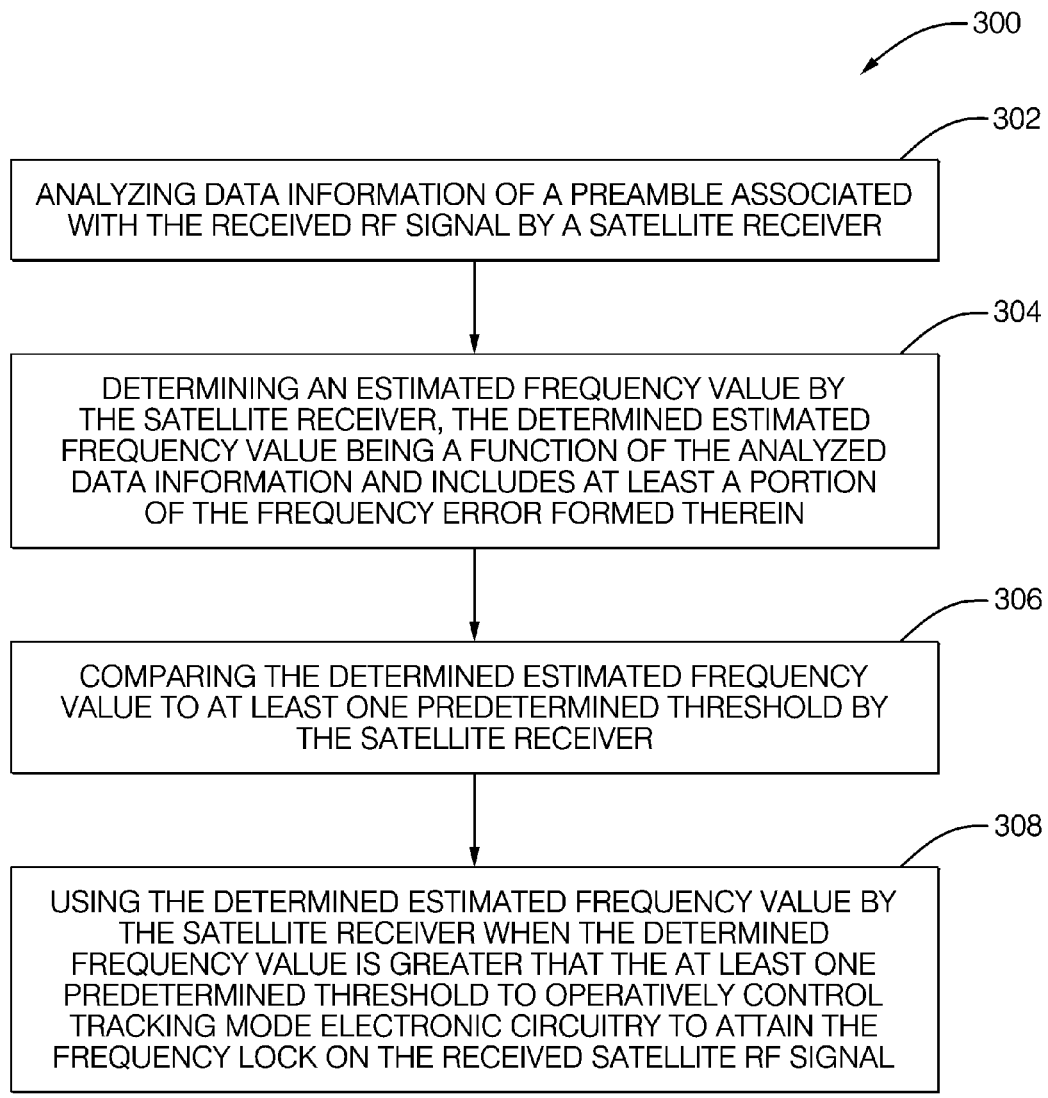
FIG. 11 shows a method to operatively control the satellite receiver that contains a subset of the steps of the method of FIG. 10.

Referring to FIG. 11, method 300 is also presented to operatively control a satellite receiver that detects frequency error between a broadcast satellite radio frequency (RF) signal and a received satellite RF signal of the broadcast satellite RF signal to attain frequency lock of the received satellite RF signal. Steps 302, 304, 306, 308 of method 300 form a subset of steps 202, 204, 206, 208, 210, 212, 214, 216, 218, 220 of method 200 illustrated in FIG. 10. One step 302 of method 300 is analyzing data information of a preamble associated with the received satellite RF signal by the satellite receiver. Step 302 of method 300 is similar to step 204 of method 200 as illustrated in FIG. 10. Another step 304 of method 300 is determining an estimated frequency value by the satellite receiver. The determined estimated frequency value is a function of the analyzed data information that further includes at least a portion of said frequency error formed therein. Step 304 of method 300 is similar to step 216 of method 200 as illustrated in FIG. 10. A further step 306 of method 300 is comparing the determined estimated frequency value to at least one predetermined threshold by the satellite receiver. Step 306 of method 300 is similar to step 218 of method 200 as illustrated in FIG. 10. Another step 308 of method 300 is using said determined estimated frequency value by the satellite receiver when the determined frequency value is greater than said at least one predetermined threshold to operatively control tracking mode electronic circuitry disposed in the satellite receiver to attain said frequency lock on the received satellite RF signal. Step 308 is similar to step 220 of method 200 as illustrated in FIG. 10.

When the determined frequency value is the same as, or less than the at least one predetermined threshold 123 on signal path does not influence the control of the tracking mode electronic circuitry 190 such that switch 181 is set to position A. This may occur in a received signal condition, such as a strong signal condition, that may be experienced in open land environment 17 as illustrated in FIG. 2. When the estimated frequency value on signal path 186 is the same or less than the predetermined threshold value 123, this ensures that threshold comparison block 115 sets switch 181 to position B. When in position B, operative control of the tracking mode electronic circuitry of the satellite receiver to attain said frequency lock on the received satellite RF signal is a function only of the output electrical signal of the Costas Phase Error electrical block 107 only so that tracking mode electronic circuitry 190 operates similarly to frequency tracking feedback loop (1) in the schematic shown in prior art FIG. 1. Thus, when switch 181 is in position B, the estimated frequency value does not influence the tracking mode electronic circuitry.

As described herein, all of steps 202, 204, 206, 208, 210, 212, 214, 216, 218, 220 for method 200 and all steps 302, 304, 306, 308 for method 300 are performed within DSP 50 by DSP 50. Alternately, one or more of respective steps 202, 204, 206, 208, 210, 212, 214, 216, 218, 220 302, 304, 306, 308 in methods 200, 300 may be performed external to the DSP. Still yet alternately, one or more of the respective steps 202, 204, 206, 208, 210, 212, 214, 216, 218, 220 302, 304, 306, 308 in methods 200, 300 may be performed in any type of communication system whether a DSP is employed in the communication system or not.

Alternately, the tracking mode feedback loop may be implemented in the analog domain in contrast to the digital domain as previously described herein.

Still yet alternately, one such method that may be employed to detect the presence of a preamble in a phase shift key carrier system is further presented in United States Publication No. 2006/0193407 entitled "METHOD AND SYSTEM USING PREAMBLE DETECTION TO DEMODULATE A PHASE SHIFT KEY CARRIER SIGNAL" filed on Feb. 28, 2005, and is further hereby incorporated by reference herein.

Thus, a satellite receiver that has a robust, improved operating performance in weak satellite signal conditions using a tracking mode feedback loop that includes a determined an estimated frequency value. The weak satellite signal condition may be caused by a thick canopy of trees or the satellite receiver disposed in a vehicle that is travelling through a tunnel such as may be experienced beneath an overpass road. The estimated frequency value is compared to a predetermined threshold value that is associated with a predetermined phase tracking range associated with the tracking mode electronic circuitry. When the determined estimated frequency value is greater than the predetermined threshold value the estimated frequency value is used by the tracking mode feedback loop to steer the tracking mode electronic circuitry in a direction towards the predetermined phase tracking range of the tracking mode electronic circuitry so that the tracking mode feedback loop may attain frequency lock of a received satellite RF signal. The tracking mode feedback loop is conveniently disposed within a DSP of the satellite receiver. When the determined estimated frequency value is the same as, or less than the predetermined threshold value the estimated frequency value does not influence the operation of the tracking mode feedback loop such as may be the case when the satellite receiver is disposed in a strong satellite signal condition that is void of the canopy of trees or tunnel obstructions. The estimated frequency value is determined by analysis of a preamble by the satellite receiver that is periodically sent and is associated with broadcast satellite RF signals that are received by the satellite receiver. A first half, or portion of the preamble and a second half, or portion of the total word length of the preamble is analyzed by the satellite receiver on a satellite RF carrier signal to generate phasor representations of the first and second portions. A difference phase error value is determined between the first and the second portion in which the estimated frequency value is a function of the difference phase error value. Using the estimated frequency value when the estimated frequency value is greater than the predetermined threshold is advantageous to ensure the tracking mode frequency loop obtains frequency lock of the received satellite RF signal so that a quality listenable audio stream for the user is effectively maintained. The satellite receiver having the tracking mode feedback loop that determines the estimated frequency value is suitable for operating in the vehicular environment where weak satellite signal conditions may often be incurred as the vehicle travels through a ground-based earth environment having an ever-changing topology. The preamble-based frequency estimate, or estimated frequency value assists to operatively control the satellite receiver by detecting frequency error between a broadcast satellite RF signal and the received satellite RF signal to better attain frequency lock of the received RF signal which results in an extended frequency lock range of the satellite receiver, especially when the satellite receiver is experiencing a weak satellite signal condition.

While this invention has been described in terms of the preferred embodiment thereof, it is not intended to be so limited, but rather only to the extent set forth in the claims that follow.

It will be readily understood by those persons skilled in the art that the present invention is susceptible for broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. A method to extend a frequency lock range of a received RF signal in a satellite receiver, comprising:
    analyzing data information of a preamble associated with the received satellite RF signal by the satellite receiver, wherein the preamble is characterized by a total word length of the preamble, wherein analyzing data information includes identifying a first portion and a second portion of the preamble within the total word length of the preamble, wherein the first portion is distinct from the from the second portion;
    determining an estimated frequency value based on the first portion and the second portion; and
    using said estimated frequency value by the satellite receiver when the determined estimated frequency value is greater than at least one predetermined threshold value to operatively control tracking mode electronic circuitry disposed in the satellite receiver to attain frequency lock on the received satellite RF signal.

2. The method according to claim 1, wherein the step of analyzing the preamble further includes,
    respectively representing the first portion and the second portion in phasor relationship by the satellite receiver, and
    determining an angular measurement between said phasor relationship of the second portion and said phasor relationship of the first portion in which the estimated frequency value is a function of the angular measurement.

3. The method according to claim 2, wherein a word length of the first portion is 50% of the total word length and a word length of the second portion is 50% of the total word length.

4. The method according to claim 1, wherein the step of analyzing said data information further includes,
    separating transmitted signal data and a satellite RF carrier signal respectively associated with said received satellite RF signal by the satellite receiver based on said analyzed data information,
    digitally sampling the satellite RF carrier signal by the satellite receiver, the satellite RF carrier signal including a first sampled portion and a second sampled portion,
    summing a phase error associated with the first sampled portion by the satellite receiver to produce a first phase error value,
    summing a phase error associated the second sampled portion by the satellite receiver to produce a second phase error value, and
    subtracting the second phase error value from the first phase error value by the satellite receiver to produce a difference phase error value in which the estimated frequency value is a function of the difference phase error value.

5. The method according to claim 1, wherein said at least one predetermined threshold value is in relation to a predetermined tracking range associated with the tracking mode electronic circuitry.

6. The method according to claim 1, wherein the step of determining the estimated frequency value is performed in an electrical feedback loop of the satellite receiver, the electrical feedback loop being disposed intermediate a frequency shifter CORDIC electrical block and a symbol demodulation electrical block of the satellite receiver.

7. The method according to claim 1, wherein the satellite receiver includes a digital signal processor (DSP) and at least the step of determining the estimated frequency value in the method occurs within the DSP.

8. The method according to claim 7, wherein the steps in the method are performed in the DSP and the tracking mode electronic circuitry is disposed in the DSP.

9. The method according to claim 1, wherein the step of using said determined estimated frequency value further includes,
    using a corrected phase error signal to operatively control said tracking mode electronic circuitry, said corrected phase error signal being a function of an absolute value applied to the Costas Phase Error output signal and a mathematical numerical sign applied to the Costas Phase Error output signal having the applied absolute value, and said mathematical numerical sign is further a function of the estimated frequency value.

10. The method according to claim 1, wherein the step of determining the estimated frequency value further includes,
    performing a mathematical arctangent trigonometric function to produce the determined estimated frequency value.

11. The method according to claim 1, wherein the step of determining the estimated frequency value further includes,
    receiving at least a portion of said data information of said preamble in to a preamble-based frequency estimation electrical block, said portion of said data information being stored in a memory in the satellite receiver, and said memory being a non-volatile-type memory.

12. The method according to claim 1, wherein said data information of the preamble is a known data sequence that occurs in both matched filter symbols of the satellite receiver that are correspondingly matched with a predetermined preamble table of the satellite receiver.

13. A method to extend a frequency lock range of a received RF signal in a satellite receiver, comprising:
    identifying a preamble associated with the received satellite RF signal by the satellite receiver, wherein the preamble is characterized by a total word length of the preamble, wherein includes a first portion and a second portion of the preamble within the total word length of the preamble, wherein the first portion is distinct from the from the second portion;
    analyzing data information disposed in the preamble by the satellite receiver;

separating transmitted signal data and a satellite RF carrier signal associated with said received satellite RF signal by the satellite receiver based on said analyzed data information;

digitally sampling the satellite RF carrier signal by the satellite receiver, the satellite RF carrier signal including the first portion of the preamble digitally sampled and the second portion of the preamble digitally sampled;

summing a phase error associated with the digitally sampled first portion by the satellite receiver to produce a first phase error value;

summing a phase error associated the digitally sampled second portion by the satellite receiver to produce a second phase error value;

subtracting the second phase error value from the first phase error value to produce a difference phase error value by the satellite receiver;

determining an estimated frequency value based on the first portion and the second portion; and using the estimated frequency value by the satellite receiver when the determined estimated frequency value is greater than said at least one predetermined threshold value to operatively control tracking mode electronic circuitry of the satellite receiver.

14. The method according to claim 13, further including, processing a first phase error value in a preamble-based frequency estimation electrical block, and processing a second phase error value after the step of processing the first phase error value, wherein the first phase error value and the second phase error value are each converted within the preamble-based frequency estimation electrical block to have phasor representation.

15. A communication system comprising:

a satellite receiver in which the satellite receiver operates according to a method to extend a frequency lock range of a received RF signal in a satellite receiver, the method includes, analyzing data information of a preamble associated with the received satellite RF signal by the satellite receiver, wherein the preamble is characterized by a total word length of the preamble, wherein analyzing data information includes identifying a first portion and a second portion of the preamble within the total word length of the preamble, wherein the first portion is distinct from the from the second portion;

determining an estimated frequency value based on the first portion and the second portion; and using said estimated frequency value by the satellite receiver when the determined frequency value is greater than said at least one predetermined threshold value to operatively control tracking mode electronic circuitry disposed in the satellite receiver to attain said frequency lock on the received satellite RF signal.

16. The communication system according to claim 15, wherein the satellite receiver includes, a digital signal processor (DSP), the DSP including, a Costas Phase Error electrical block, and a frequency shifter CORDIC electrical block, wherein at least a portion of the determined estimated frequency value is input to an electrical signal path of the DSP at a point in the electrical signal path that is disposed intermediate the frequency shifter CORDIC electrical block and the Costas Phase Error electrical block.

17. The communication system according to claim 15, wherein the frequency shifter CORDIC electrical block has an input and an end of said electrical signal path electrically connects with said input so that at least the portion of the determined estimated frequency value is configured for electrical transmission to said input.

18. The communication system according to claim 15, wherein the at least one predetermined threshold value is in relation to a predetermined tracking range associated with the tracking mode electronic circuitry, and when the at least one predetermined threshold value is the same as, or less than the determined estimated frequency value, the determined estimated frequency value has no operative control of the tracking mode electronic circuitry.

19. The communication system according to claim 15, wherein the satellite receiver further includes, a digital signal processor (DSP) that includes electronic circuitry, and at least a portion of the steps in the method are performed by the electronic circuitry of the DSP.

20. The communication system according to claim 15, wherein the satellite receiver includes, electrical circuitry that contains at least one electrical feedback loop that performs the step of determining the estimated frequency value and further produces a corrected phase error electrical signal, and the corrected phase error electrical signal is used to operatively control said tracking mode electronic circuitry, said corrected phase error electrical signal being a function of an absolute value applied to the Costas Phase Error output signal and a mathematical numerical sign applied to the Costas Phase Error output signal having the applied absolute value, and said mathematical numerical sign is further a function of the estimated frequency value.

21. The communication system according to claim 15, wherein the communication system is at least one of, (i) quadrature phase-shift keying (QPSK)

(ii) binary phase-shift keying (BPSK), and (iii) multiple phase-shift keying (MPSK).

22. The communication system according to claim 15, wherein said communication system is disposed in a vehicle.

* * * * *